(12) United States Patent
Zhang et al.

(10) Patent No.: US 10,050,061 B2
(45) Date of Patent: Aug. 14, 2018

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventors: Yuanbo Zhang, Beijing (CN); Wei Qin, Beijing (CN); Seung Woo Han, Beijing (CN); Ruoyu Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 201 days.

(21) Appl. No.: 14/402,266

(22) PCT Filed: Dec. 10, 2013

(86) PCT No.: PCT/CN2013/088909
§ 371 (c)(1),
(2) Date: Oct. 26, 2015

(87) PCT Pub. No.: WO2015/039389
PCT Pub. Date: Mar. 26, 2015

(65) Prior Publication Data
US 2016/0049424 A1    Feb. 18, 2016

(30) Foreign Application Priority Data
Sep. 18, 2013  (CN) .......................... 2013 1 0430676

(51) Int. Cl.
*G02F 1/1343*    (2006.01)
*H01L 27/12*    (2006.01)

(52) U.S. Cl.
CPC ........ *H01L 27/124* (2013.01); *H01L 27/1259* (2013.01)

(58) Field of Classification Search
CPC .......................... H01L 27/124; H01L 27/1259
(Continued)

(56) References Cited

U.S. PATENT DOCUMENTS 7,855,773 B2    12/2010  Chen
7,872,722 B2 *   1/2011  Kimura ............... H01L 27/1218
                                                  349/114
(Continued)

FOREIGN PATENT DOCUMENTS

CN    101311787 A    11/2008
CN    102569187 A     7/2012
(Continued)

OTHER PUBLICATIONS

International Search Report, International Preliminary Report on Patentability and Written Opinion of the International Searching Authority of PCT/CN2013/088909 in Chinese, dated Jun. 16, 2014.
(Continued)

*Primary Examiner* — Edward Glick
*Assistant Examiner* — David Chung
(74) *Attorney, Agent, or Firm* — Collard & Roe, P.C.

(57) ABSTRACT

An array substrate, a manufacturing method of the array substrate and a display device including the array substrate are disclosed. The array substrate includes a substrate (1), a common electrode layer (401) located on the substrate (1) and a conductive layer (2) provided on a surface of the substrate (1), the conductive layer (2) and the common electrode layer (401) are electrically connected in parallel. The common electrode and the conductive layer are formed into a parallel structure, so that the resistance can be decreased, and in turn, crosstalk, greenish and other phenomenon of the array substrate are reduced, thereby promoting the picture quality of the display device.

10 Claims, 2 Drawing Sheets

(58) Field of Classification Search
USPC .................................................. 349/43, 141
See application file for complete search history.

(56) References Cited

U.S. PATENT DOCUMENTS

| | | | | |
|---|---|---|---|---|
| 8,941,804 B2* | 1/2015 | Kawashima | ...... | G02F 1/134336 349/141 |
| 2007/0058097 A1* | 3/2007 | Kato | ................. | G02F 1/136213 349/38 |
| 2007/0126969 A1* | 6/2007 | Kimura | ............ | G02F 1/134363 349/141 |
| 2007/0284627 A1* | 12/2007 | Kimura | ............ | G02F 1/134363 257/257 |
| 2010/0079693 A1* | 4/2010 | Yoshida | ............ | G02F 1/134363 349/40 |
| 2010/0079694 A1* | 4/2010 | Yoshida | ............ | G02F 1/134363 349/40 |
| 2010/0123845 A1* | 5/2010 | Kim | ...................... | H01L 27/124 349/46 |
| 2010/0123866 A1 | 5/2010 | Chang et al. | | |
| 2011/0122330 A1* | 5/2011 | Tae | ................... | G02F 1/136213 349/39 |
| 2012/0092606 A1* | 4/2012 | Tai | ...................... | H01L 27/1214 349/141 |

FOREIGN PATENT DOCUMENTS

| | | |
|---|---|---|
| CN | 102937767 A | 2/2013 |
| CN | 103208491 A | 7/2013 |
| CN | 102569187 B | 8/2014 |

OTHER PUBLICATIONS

English translation of the International Preliminary Report on Patentability and Written Opinion of the International Searching Authority of PCT/CN2013/088909, dated Mar. 22, 2016.
Chinese Office Action of Chinese Application No. 201310430676.X, dated Jun. 2, 2015 with English translation.
Written Opinion of the International Searching Authority of PCT/CN2013/088909 in English, dated Jun. 16, 2014.
Chinese Office Action of Chinese Application No. 201310430676.X, dated Sep. 16, 2015, with English translation.
English Translation of the International Search Report of PCT/CN2013/088909 published in English dated Mar. 26, 2015.

* cited by examiner

ARRAY SUBSTRATE AND MANUFACTURING METHOD THEREOF, DISPLAY DEVICE

CROSS REFERENCE TO RELATED APPLICATIONS

This application is the National Stage of PCT/CN2013/088909 filed on Dec. 10, 2013, which claims priority under 35 U.S.C. § 119 of Chinese Application No. 201310430676.X filed on Sep. 18, 2013, the disclosure of which is incorporated by reference.

TECHNICAL FIELD

Embodiments of the present invention relate to an array substrate and a manufacturing method thereof, a display device.

BACKGROUND

A technical characteristics of the Advanced Super Dimension Switch (ADS) technology is that a multi-dimensional electric field is formed by an electric field produced at edges of slit electrodes on the same plane and an electric field produced between a layer of the slit electrodes and a layer of a plate-like electrode, so as to allow liquid crystal molecules with every alignment within a liquid crystal cell, which are located directly above the electrode and between the slit electrodes, to be rotated, and thereby the work efficiency of liquid crystals is enhanced and the transmissive efficiency is increased. The ADS technology can improve the picture quality of thin film transistor liquid crystal display (TFT-LCD) products, and has the advantages of high resolution, high transmittance, low power consumption, wide viewing angle, high aperture ratio, low chromatic aberration, push Mura-free, etc.

With respect to diverse applications, improved technologies of the ADS technology comprise high-transmittance (I-ADS) technology, high-aperture-ratio (H-ADS) technology, high-resolution (S-ADS) technology, and so on.

FIG. 1 is a structurally schematic view illustrating an array substrate of an existing HADS mode liquid crystal panel. As shown in FIG. 1, the array substrate of the existing liquid crystal panel includes: a substrate 1, a common electrode 401, a gate electrode 402, a gate insulating layer 403, a semiconductor layer 404, a first passivation layer 405, a source electrode 406a, a drain electrode 406b, a second passivation layer 407, and a pixel electrode 408. In a peripheral portion of the region where the common electrode 401 is located, a transparent conductive thin film for the common electrode 401 is connected to a common electrode metal line in the periphery portion of the array substrate through a via hole, thereby achieving the function of transmitting a common electrode electric signal for the array substrate.

However, drawbacks of the structure are as follows. In a HADS mode, the resistance of a common electrode using a transparent conductive thin film ranges between hundreds to thousands ohms approximately. The resistivity of the transparent conductive thin film is higher than the resistivity of a metal, and this causes the common electrode to have higher resistance consequently. This easily leads to crosstalk in the array substrate, greenish upon display, or other phenomenon, thereby affecting the picture quality of the display device.

SUMMARY

According to embodiments of the invention, there are provided an array substrate and manufacturing method thereof, a display device, capable of reducing crosstalk in the array substrate, greenish upon display and other phenomenon, and promoting the picture quality of the display device.

In an aspect of the invention, there is provided an array substrate, comprising: a substrate, a common electrode layer located on the substrate and a conductive layer lying in a different layer from the common electrode layer, the conductive layer and the common electrode layer are electrically connected in parallel.

For example, in the array substrate, the conductive layer is provided on a surface of the substrate, and the common electrode layer is located above the conductive layer.

For example, in the array substrate, the substance of the conductive layer may be a metal layer or a transparent conductive thin film.

For example, the array substrate may further includes: an insulating layer provided on the conductive layer; a gate electrode provided on the insulating layer; a gate insulating layer provided on the gate electrode; an active layer provided on the gate insulating layer; a source electrode and a drain electrode that are provided on the active layer; a first passivation layer provided on the source electrode and the drain electrode; a pixel electrode provided on the first passivation layer; a second passivation layer provided on the pixel electrode; a common electrode layer provided on the second passivation layer. The conductive layer and the common electrode layer are electrically connected through a via hole.

For example, in the array substrate, the conductive layer is electrically connected to the common electrode layer through a common electrode metal line.

For another example, the array substrate may further includes a gate electrode provided on a surface of the substrate, and a gate insulating layer provided on a surface of the gate electrode, the conductive layer is provided on a surface of the gate insulating layer, and the common electrode layer and the conductive layer lie in different layers.

For example, in the array substrate, a projection area of the conductive layer upon the substrate does not overlap with a projection area of the gate electrode upon the substrate.

In another aspect of the invention, there is further provided a display device, comprising the array substrate as stated in any of above items.

In still another aspect of the invention, there is further provided a manufacturing method of an array substrate, comprising: forming a conductive layer on a substrate; forming a common electrode layer on the conductive layer, and the conductive layer and the common electrode layer are electrically connected in parallel.

For example, the manufacturing method of the array substrate may includes: forming the conductive layer on a surface of the substrate; forming an insulating layer on the conductive layer; forming a gate electrode on the insulating layer; forming a gate insulating layer on the gate electrode; forming an active layer on the gate insulating layer; forming a source electrode and a drain electrode on the active layer; forming a first passivation layer on the source electrode and the drain electrode; forming a pixel electrode on the first passivation layer; forming a second passivation layer on the pixel electrode; forming the common electrode layer on the second passivation layer; wherein the conductive layer and the common electrode layer are electrically connected through a via hole.

For example, in the method, the conductive layer and the common electrode layer are electrically connected through a common electrode metal line.

For another example, the manufacturing method of the array substrate may include: forming a gate layer provided at a surface of the substrate; forming a gate insulating layer provided at a surface of the gate electrode; forming a conductive layer provided at a surface of the gate insulating layer, the common electrode layer and the conductive layer lie in different layers.

For example, in the method, a region on the substrate where the conductive layer is formed does not overlap with a projection area of the gate electrode upon the substrate.

For example, in the method, the substance of the conductive layer may be a metal or a transparent conductive material.

According to embodiments of the invention, the common electrode and the conductive layer are formed into a parallel structure, so as to decrease the resistance value of the common electrode, and in turn, crosstalk, greenish and other phenomenon of the array substrate are reduced, thereby promoting the picture quality of the display device.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but are not limitative of the invention.

REFERENCE NUMERALS

1: substrate; 2: conductive layer; 3: an insulating layer; 401: common electrode layer; 402: gate electrode; 403: gate insulating layer; 404: semiconductor layer; 405: first passivation layer; 406a: source electrode; 406b: drain electrode; 407: second passivation layer; 408: pixel electrode; 409: gate line; 5: via hole; 6: fan-out lead area; 7: FPC; 8: liquid crystal cell test unit; 9: D-IC; 10: GOA; 11: common electrode metal line.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which come(s) within the scope sought for protection by the invention.

According to an embodiment of the invention, there is provided an array substrate, which includes a substrate and a common electrode layer located on the substrate, and further includes a conductive layer lying in a different layer from the common electrode layer, and the conductive layer and the common electrode layer are electrically connected in parallel.

The conductive layer may be provided on the surface of the substrate, or, the conductive layer is provided on the surface of the gate insulating layer, and the common electrode layer and the conductive layer lie in different layers.

It is to be noted that, in embodiments of the invention, position of the conductive layer is not limited to surface of the substrate, and it may be located above the gate insulating layer. However, if the conductive layer is located above the gate insulating layer, then coupling capacitance with the other electrode will be incurred, while the coupling capacitance may be decreased if the conductive layer is provided on the surface of the substrate.

Figure 1:
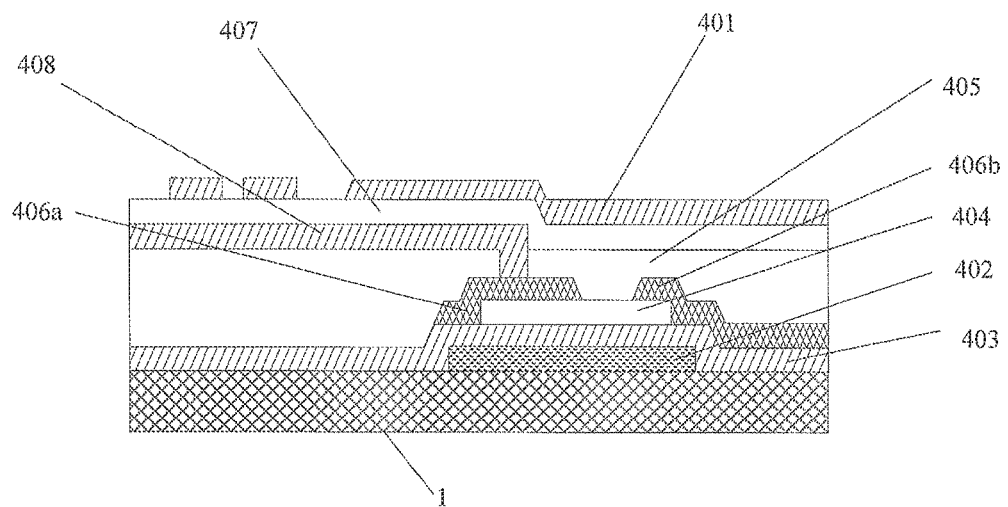
FIG. 1 is a structurally schematic view illustrating a conventional array substrate.
Figure 2:
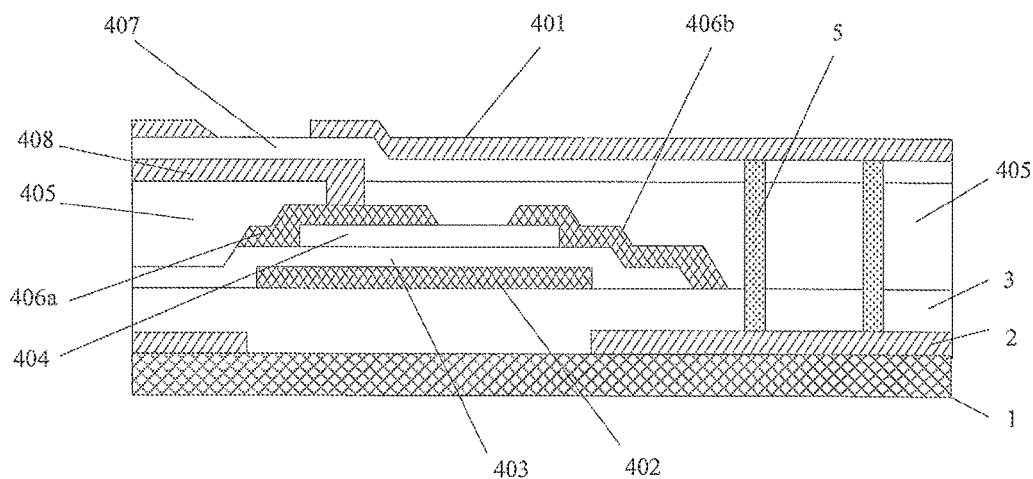
FIG. 2 is a schematic view illustrating the detailed structure of an array substrate as stated in an embodiment of the invention.

FIG. 2 is a structurally schematic view illustrating an array substrate provided by an embodiment of the invention. As shown in FIG. 2, the array substrate includes a substrate 1, a common electrode layer 401 located on the substrate 1 and a conductive layer 2 provided on the surface of the substrate 1, and the conductive layer 2 and the common electrode layer 401 are electrically connected in parallel. Here, the conductive layer 2 being provided on the surface of the substrate 1 means that it directly contacts with the substrate 1. The substrate 1 may be a glass substrate, a plastic substrate or the like.

The common electrode layer 401 and the conductive layer 2 are electrically connected through a via hole 5, so that the equivalent resistance of the common electrode layer 401 and the conductive layer 2 is of a parallel structure. Or, the conductive layer 2 may also be electrically connected to the common electrode layer 401 through a common electrode metal line (not shown) located in the periphery of the common electrode layer.

With respect to the array substrate in embodiments of the invention, a conductive layer is formed on the surface of a substrate, and a common electrode on the array substrate is made to be electrically connected to the conductive layer through a via hole, so that the common electrode and the conductive layer are formed into a parallel structure. This structure can achieve the function of decreasing resistance of the common electrode. In turn, crosstalk, greenish and other phenomenon of the array substrate are reduced, and the picture quality of the display device is enhanced.

For example, the conductive layer may be formed of a metal or a transparent conductive thin film. It may not be limited that the conductive layer adopts what kind of material concretely, and the only consideration is that, whether or not the common electrode and the conductive layer can be made to be a parallel structure, so that the equivalent resistance of the parallel structure is decreased compared with the own resistance value of the common electrode. If a metal is used for manufacture of the conductive layer, then the conductive layer may be disposed in a non-display region for the purpose of not affecting aperture ratio of the array substrate. A display region of the array substrate is located in the middle portion, and the non-display region is located along the periphery of the display region.

For example, the array substrate according to embodiments of the invention includes a plurality of gate lines and a plurality of data lines that cross over each other to thereby define pixel units arranged in the form of a matrix, each of which includes a thin film transistor functioning as a switch element as well as a pixel electrode and a common electrode that are configured for control of the arrangement of liquid crystals. For example, as for the thin film transistor of each pixel, its gate electrode is electrically connected to or integrally formed with a respective gate line, its source electrode is electrically connected to or integrally formed with a respective data line, and its drain electrode is electrically connected to or integrally formed with a respective pixel electrode. The following descriptions are mainly made with reference to a single pixel unit or pixel units, but other pixel unit(s) can be formed in the same way.

For example, on the array substrate according to embodiments of the invention, there is provided a gate electrode, and a projection area of the conductive layer upon the substrate does not overlap with a projection area of the gate electrode upon the substrate. The structure is used for reducing the effect of the conductive layer on the gate electrode, so that influence on the performance of the thin film transistor is avoided.

FIG. 2 is a schematic view illustrating the detailed structure of an array substrate according to an embodiment of the invention. As shown in FIG. 2, the array substrate includes: a substrate 1, an upper conductive layer 2 formed on the substrate 1; an insulating layer 3 located on the conductive layer; a gate electrode 402 located on the insulating layer 3; a gate insulating layer 403 located on the gate electrode 402; a semiconductor layer 404 (an active layer) located on the gate insulating layer 403; a source electrode 406a and a drain electrode 406b that are located on the semiconductor layer 404; a first passivation layer 405 located on the source electrode 406a and the drain electrode 406b; a pixel electrode 408 located on the first passivation layer 405; a second passivation layer 407 located on the pixel electrode 408; and a common electrode layer 401 located on the second passivation layer 407. The conductive layer 2 and the common electrode layer 401 are electrically connected through at least two via holes 5. The insulating layer 3 acts to make the conductive layer 2 insulated from other layered structure component on the array substrate, so as to avoid the conductive layer from interfering with other electrode on the array substrate. The via holes 5 pass through the insulating layer 3, the first passivation layer 405 and the second passivation layer 407.

The structure of one pixel unit of the array substrate is shown in FIG. 2 as an example only. A bottom-gate thin film transistor is employed in the pixel unit as an example, but the present invention is not limited thereto. In the pixel structure, the common electrode 401 is located above the pixel electrode 408, while in another example, the common electrode may also be provided below the pixel electrode. The common electrode and the pixel electrode may be of a slit electrode (having an opening) or a plate-like electrode. The semiconductor layer 404 may be of amorphous silicon, polysilicon, an oxide semiconductor (such as IGZO) or the like.

The array substrate includes the common electrode 401, and the common electrode 401 and the conductive layer 2 may be electrically connected through at least two via holes 5, which makes the common electrode 401 and the conductive layer 2 formed into a parallel structure. In the embodiment, a projection area of the conductive layer 2 upon the substrate 1 does not overlap with a projection area of the gate electrode 402 upon the substrate 1.

Figure 3:
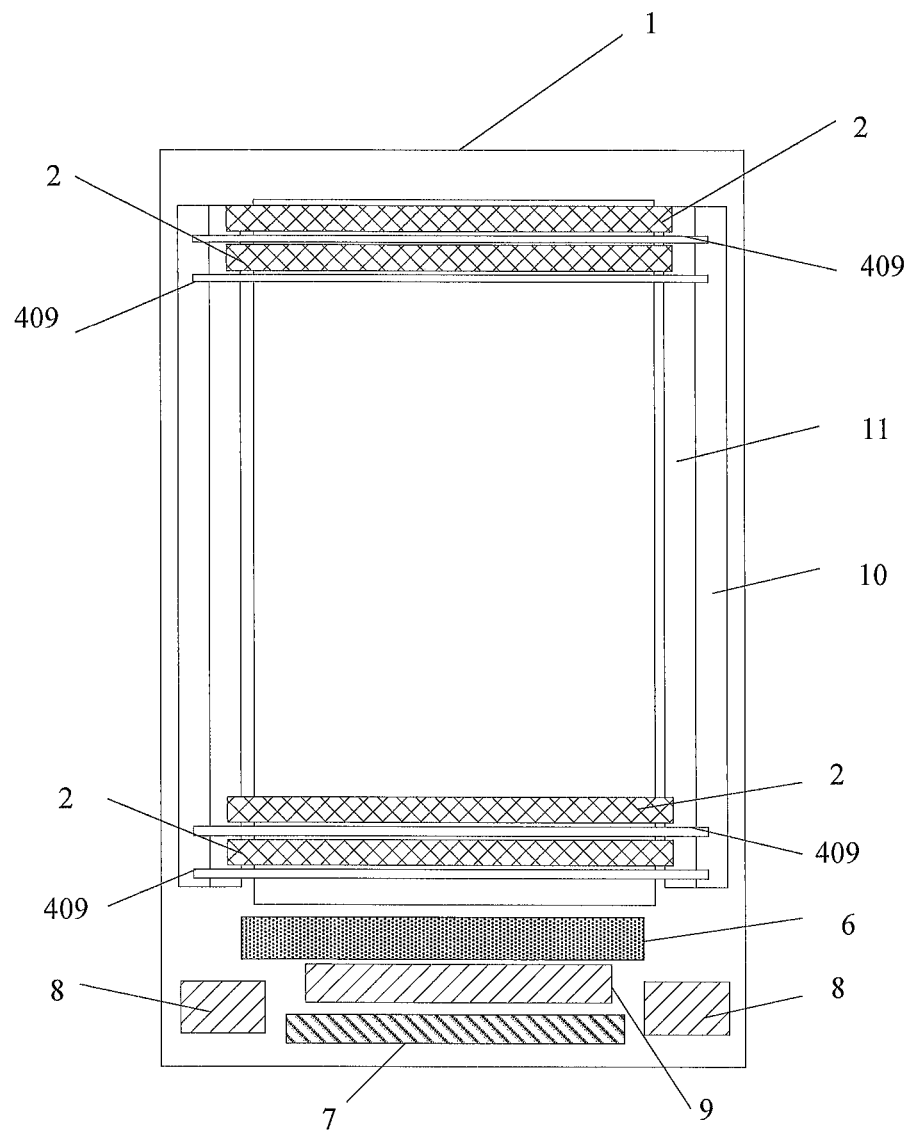
FIG. 3 is a schematic top view illustrating the detailed structure of an array substrate as stated in an embodiment of the invention.

FIG. 3 is a schematic top view illustrating the detailed structure of an array substrate as stated in an embodiment of the invention, and as shown in FIG. 3, a conductive layer 2 and a gate line 409 are formed on the substrate 1. The projection area of the conductive layer 2 upon the substrate 1 does not overlap with the projection area of the gate line 409 upon the substrate 1. Furthermore, as shown in FIG. 3, with respect to the array substrate according to an embodiment of the invention, the following items are further included on the substrate 1: a fan-out lead area 6, an FPC (flexible printed circuit) 7, a liquid crystal cell test (Cell test) unit 8, a D-IC (data drive integrated circuit) 9, a GOA. (gate drive unit) 10 and a common electrode metal line 11 located along the periphery of the common electrode layer.

For example, the projection area of the conductive layer 2 upon the substrate does not overlap with the projection area of the gate electrode upon the substrate; while the conductive layer 2 overlaps with the pixel electrode 408 within a pixel region, which forms one extra capacitor between the pixel electrode and the conductive layer, so that the capacity value of the storage capacitor Cst can be increased.

According to the embodiment, there is further provided a display device, comprising the array substrate as stated in an embodiment of the invention and a counter substrate.

The array substrate and the counter substrate are disposed opposite to each other so as to form a liquid crystal cell, and a liquid crystal material is filled in the liquid crystal cell. The counter substrate may be a color filter substrate for example. A pixel electrode for each of the pixels of the array substrate acts to apply an electric field for control of the degree of rotation of the liquid crystal material so as to perform the display operation. In some examples, the liquid crystal display device further includes a backlight for providing the array substrate with backlight.

With the display device as stated in embodiments of the invention, crosstalk in the array substrate, greenish upon display and other phenomenon can be reduced, thereby promoting the picture quality of the display device.

Correspondingly, a manufacturing method of an array substrate is further provided by an embodiment of the invention. The method includes: forming a conductive layer on a substrate; and forming a common electrode layer on the conductive layer. The conductive layer and the common electrode layer are electrically connected in parallel.

For example, the following steps may be used to implement the embodiment. Here, the conductive layer is provided on the surface of the substrate, and optionally, the conductive layer may also be provided on a gate insulating layer.

Step S1, a conductive layer is formed on a substrate, and an insulating layer is formed on the conductive layer;

Step S2, a gate electrode is formed on the insulating layer; a gate insulating layer is formed on the gate electrode; an active layer is formed on the gate insulating layer; a source electrode and a drain electrode are formed on the active layer; a first passivation layer is formed on the source electrode and the drain electrode; a pixel electrode is formed on the first passivation layer; a second passivation layer is formed on the pixel electrode; a common electrode is formed on the second passivation layer; and the conductive layer and the common electrode layer are electrically connected through a via hole.

Here, the common electrode layer and the conductive layer are electrically connected through a via hole, so that the common electrode layer and the conductive layer are formed into a parallel structure.

It is possible that a conductive layer and an insulating layer are formed on the circuit substrate in advance, and then in a subsequent manufacturing process of the array substrate, the conductive layer and its surrounding common electrode metal line are electrically connected through a via hole, so that the common electrode and the conductive layer are formed into a parallel structure. The equivalent resistance of the parallel structure is smaller than the resistance of the common electrode, so that the function of decreasing resistance of the common electrode can be achieved. In turn, crosstalk, greenish upon display and other phenomenon in the array substrate are reduced, and the picture quality of the display device is enhanced.

Specifically, as regards the manufacturing method of the array substrate as stated in the embodiment of the invention, the circuit substrate includes a gate electrode, the conductive layer is formed on the substrate, and the projection area of the conductive layer can be made to not overlap with the projection area of the gate electrode upon the substrate, so as to decrease load of a gate line and the common electrode.

For example, a manufacturing method of an array substrate is provided by an embodiment of the invention, and an HADS mode is adopted by the method. In this mode, the manufacturing method includes the following steps.

Step S1, a conductive layer is deposited and a pattern thereof is produced on a substrate 1, and the conductive layer is made of a transparent conductive thin film.

For example, upon formation of the pattern of the conductive layer, the projection area of the conductive layer upon the substrate can be made to not overlap with the projection area of a gate-line pattern pre-designed for the array substrate upon the substrate, and the projection area of the conductive layer upon the substrate is made to not overlap with the projection area of a gate-electrode pattern pre-designed for the array substrate upon the substrate.

Step S2, an insulating layer is formed on the conductive layer.

Step S3, a gate electrode, a gate insulating layer, an active layer, source and drain electrodes, a first passivation layer, a pixel electrode, a second passivation layer and a common electrode are formed on the insulating layer sequentially.

An example of the step S3 is as follows:

Step S301, a gate metal is deposited and a pattern thereof is produced;

Step S302, a gate insulating layer is deposited;

Step S303, an amorphous silicon (a-Si) semiconductor layer and a source/drain electrode layer are deposited, and formed into an active layer and source and drain electrodes through a patterning process;

Step S304, a first passivation layer is deposited; and a pixel electrode and a second passivation layer are formed on the first passivation layer.

Step S4, a common electrode is formed on the second passivation layer through a patterning process, and a via hole is formed in the second passivation layer, the first passivation layer and the insulating layer in the array substrate.

Here, the common electrode and the conductive layer are electrically connected through the via hole, so that the common electrode and the conductive layer are formed into a parallel structure.

In addition, the conductive layer may also be located on a gate insulating layer. In this example, the manufacturing method includes: forming a gate layer provided on the surface of a substrate; forming a gate insulating layer provided on the surface of a gate electrode; forming a conductive layer provided on the surface of the gate insulating layer. Likewise, the common electrode layer and the conductive layer lie in different layers. After that, a semiconductor layer, a source/drain electrode layer, a pixel electrode layer, a common electrode layer and other structures are then manufacture.

The transparent conductive thin film for manufacturing the conductive layer in the embodiment may also be replaced with a metal layer, and in this case, a conductive pattern produced by the metal layer can be formed in a non-display region or a black-matrix region only.

The descriptions made above are merely exemplary embodiments of the invention, but are not used to limit the protection scope of the invention. The protection scope of the invention is defined by attached claims.

The invention claimed is:

1. An array substrate, comprising: a substrate, a common electrode layer located on the substrate, a conductive layer lying in a different layer from the common electrode layer and a gate electrode located in a different layer from the conductive layer, the conductive layer and the common electrode layer being electrically connected in parallel, and the conductive layer overlapping with a pixel electrode within a pixel region in a direction perpendicular to the substrate;

wherein the conductive layer is formed of a transparent conductive material;

wherein the conductive layer is provided at a surface of the substrate, and the common electrode layer is located above the conductive layer;

wherein the array substrate further comprises: an insulating layer, a gate insulating layer, an active layer, a source electrode and a drain electrode, a first passivation layer, and a second passivation layer;

wherein the conductive layer, the insulating layer, the gate electrode, the gate insulating layer, the active layer, the source electrode and drain electrode, the first passivation layer, the pixel electrode, the second passivation layer, and the common electrode layer are sequentially provided on the substrate;

wherein the conductive layer and the common electrode layer are electrically connected through a via hole in the insulating layer, the first passivation layer, and the second passivation layer.

2. The array substrate claimed as claim 1, wherein the conductive layer is electrically connected to the common electrode layer through a common electrode metal line.

3. The array substrate claimed as claim 1, wherein a projection area of the conductive layer upon the substrate does not overlap with a projection area of the gate electrode upon the substrate.

4. A display device, comprising the array substrate claimed as claim 1.

5. The array substrate claimed as claim 1, wherein
the common electrode layer is located at a side of the pixel electrode far away from the substrate.

6. The array substrate claimed as claim 1, wherein
the common electrode layer is electrically connected with the conductive layer through two via holes.

7. A manufacturing method of an array substrate, comprising:

forming a conductive layer lying on a substrate;
forming a gate electrode on a side of the conductive layer far away from the substrate;
forming a common electrode layer on the conductive layer;
forming the conductive layer at a surface of the substrate;
forming an insulating layer on the conductive layer;
forming a gate electrode on the insulating layer;
forming a gate insulating layer on the gate electrode;
forming an active layer on the gate insulating layer;
forming a source electrode and a drain electrode on the active layer;

forming a first passivation layer on the source electrode and the drain electrode;

forming a pixel electrode on the first passivation layer;

forming a second passivation layer on the pixel electrode;

forming the common electrode layer on the second passivation layer;

wherein the conductive layer and the common electrode layer are electrically connected through a via hole wherein the conductive layer and the common electrode layer are electrically connected in parallel, and the conductive layer overlaps with a pixel electrode within a pixel region in a direction perpendicular to the substrate;

the conductive layer is formed of a transparent conductive material.

8. The manufacturing method claimed as claim 7, wherein the conductive layer and the common electrode layer are electrically connected through a common electrode metal line.

9. The manufacturing method claimed as claim 7, wherein a region upon the substrate where the conductive layer is formed does not overlap with a projection area of the gate electrode upon the substrate.

10. An array substrate, comprising: a substrate, a common electrode layer located on the substrate and a conductive layer lying in a different layer from the common electrode layer;

wherein the conductive layer is formed of a metal, and the conductive layer and the common electrode layer being electrically connected in parallel;

the array substrate further comprises a display region and a non-display region, the display region is located in a middle portion of the array substrate and comprises a plurality of pixel units, each pixel unit comprises a pixel electrode and a common electrode, the non-display region is located along a periphery of the display region, and the conductive layer is disposed in the non-display region;

wherein the conductive layer is provided at a surface of the substrate, and the common electrode layer is located above the conductive layer;

wherein the array substrate further comprises: an insulating layer, a gate electrode, a gate insulating layer, an active layer, a source electrode and a drain electrode, a first passivation layer, and a second passivation layer;

wherein the conductive layer, the insulating layer, the gate electrode, the gate insulating layer, the active layer, the source electrode and drain electrode, the first passivation layer, the pixel electrode, the second passivation layer, and the common electrode layer are sequentially provided on the substrate;

wherein the conductive layer and the common electrode layer are electrically connected through a via hole in the insulating layer, the first passivation layer, and the second passivation layer.

* * * * *